(12) United States Patent
Asakura (10) Patent No.: US 8,789,578 B2
(45) Date of Patent: Jul. 29, 2014

(54) COOLING STRUCTURE FOR ELECTRIC DEVICE

(75) Inventor: Ken Asakura, Toyota (JP)

(73) Assignee: Toyota Jidosha Kabushiki Kaisha, Aichi-ken (JP)

( * ) Notice: Subject to any disclaimer, the term of this patent is extended or adjusted under 35 U.S.C. 154(b) by 1641 days.

(21) Appl. No.: 12/091,931

(22) PCT Filed: Oct. 26, 2006

(86) PCT No.: PCT/JP2006/321931
§ 371 (c)(1),
(2), (4) Date: Apr. 28, 2008

(87) PCT Pub. No.: WO2007/049807
PCT Pub. Date: May 3, 2007

(65) Prior Publication Data
US 2009/0095450 A1    Apr. 16, 2009

(30) Foreign Application Priority Data

Oct. 28, 2005   (JP) .................................. 2005-314757

(51) Int. Cl.
*F28F 7/00*     (2006.01)
*F28D 15/00*    (2006.01)
*H05K 7/20*     (2006.01)
*H01L 23/473*   (2006.01)

(52) U.S. Cl.
CPC .......... *H05K 7/20927* (2013.01); *H01L 23/473* (2013.01)
USPC ................ 165/104.33; 165/80.2; 165/104.11; 165/104.19; 361/701; 361/702; 257/714; 257/722

(58) Field of Classification Search
USPC ........ 165/104.11, 104.19, 104.33, 80.2, 80.3, 165/80.4, 109.1, 104.34, 185; 361/695, 361/701, 702, 710; 257/712, 714, 722
See application file for complete search history.

(56) References Cited

U.S. PATENT DOCUMENTS

| | | | | |
|---|---|---|---|---|
| 4,103,737 A | * | 8/1978 | Perkins ...................... | 165/109.1 |
| 4,327,398 A | * | 4/1982 | Christison ..................... | 361/695 |
| 4,541,004 A | * | 9/1985 | Moore .......................... | 257/706 |
| 4,733,293 A | * | 3/1988 | Gabuzda ....................... | 257/697 |
| 4,823,869 A | * | 4/1989 | Arnold et al. ................. | 165/185 |
| 4,838,041 A | * | 6/1989 | Bellows et al. .............. | 165/80.2 |

(Continued)

FOREIGN PATENT DOCUMENTS

| | | |
|---|---|---|
| DE | 43 22 665 A1 | 1/1994 |
| DE | 43 22 665 A1 | 7/2011 |

(Continued)

OTHER PUBLICATIONS

German Office Action dated Jun. 7, 2011, corresponding to German Patent Application No. 11 2006 002 839.1-33.

*Primary Examiner* — Ljiljana Ciric
(74) *Attorney, Agent, or Firm* — Sughrue Mion, PLLC (57) ABSTRACT

A cooling structure for an electric device includes a plurality of cooling medium paths (724) through which a cooling medium for an inverter flows, an inlet (722) into which the cooling medium to be supplied to the plurality of cooling medium paths (724) flows, and a wall (726) provided between the inlet (722) and the plurality of cooling medium paths (724) to promote distribution of the cooling medium to each of the cooling medium paths (724).

3 Claims, 5 Drawing Sheets

(56) References Cited

U.S. PATENT DOCUMENTS

| | | | |
|---|---|---|---|
| 4,899,210 A * | 2/1990 | Lorenzetti et al. | 257/712 |
| 4,953,634 A * | 9/1990 | Nelson et al. | 165/80.3 |
| 5,002,123 A * | 3/1991 | Nelson et al. | 165/80.3 |
| 5,019,880 A * | 5/1991 | Higgins, III | 257/714 |
| 5,072,787 A * | 12/1991 | Nakamichi | 165/80.3 |
| 5,077,601 A * | 12/1991 | Hatada et al. | 165/80.3 |
| 5,132,780 A * | 7/1992 | Higgins, III | 165/104.34 |
| 5,297,005 A * | 3/1994 | Gourdine | 361/695 |
| 5,304,845 A * | 4/1994 | Lindquist et al. | 257/712 |
| 5,388,635 A * | 2/1995 | Gruber et al. | 165/80.4 |
| 5,563,768 A * | 10/1996 | Perdue | 361/695 |
| 5,844,313 A * | 12/1998 | Hoffmann | 257/712 |
| 5,963,795 A * | 10/1999 | Schneider et al. | 438/122 |
| 6,179,046 B1 * | 1/2001 | Hwang et al. | 165/80.3 |
| 6,219,242 B1 * | 4/2001 | Martinez | 361/695 |
| 6,371,200 B1 * | 4/2002 | Eaton | 165/104.33 |
| 6,450,251 B1 * | 9/2002 | Lin et al. | 361/695 |
| 6,498,395 B2 * | 12/2002 | Baek et al. | 257/722 |
| 6,691,768 B2 * | 2/2004 | Hsieh et al. | 165/80.3 |
| 6,764,782 B2 * | 7/2004 | Raiser et al. | 429/430 |
| 6,842,340 B2 * | 1/2005 | Chang | 361/695 |
| 6,867,973 B2 * | 3/2005 | Chang | 165/109.1 |
| 6,912,129 B2 * | 6/2005 | Baker et al. | 361/695 |
| 6,935,419 B2 * | 8/2005 | Malone et al. | 165/80.3 |
| 6,942,025 B2 * | 9/2005 | Nair et al. | 165/185 |
| 7,148,452 B2 * | 12/2006 | Peterson et al. | 165/80.3 |
| 7,212,405 B2 * | 5/2007 | Prasher et al. | 361/699 |
| 7,269,011 B2 * | 9/2007 | Bhatti et al. | 165/80.4 |
| 7,331,380 B2 * | 2/2008 | Ghosh et al. | 165/104.33 |
| 7,508,664 B2 * | 3/2009 | Holland | 361/695 |
| 7,539,017 B2 * | 5/2009 | Chang | 361/710 |
| 7,558,061 B2 * | 7/2009 | Franz et al. | 361/695 |
| 7,597,135 B2 * | 10/2009 | Ghosh et al. | 165/80.4 |
| 7,710,722 B2 * | 5/2010 | Suzuki et al. | 361/701 |
| 7,719,836 B2 * | 5/2010 | Franz et al. | 361/695 |
| 8,050,036 B2 * | 11/2011 | Suzuki et al. | 165/104.33 |
| 2003/0205054 A1 | 11/2003 | Nori et al. | |
| 2006/0023425 A1 * | 2/2006 | Iijima et al. | 361/699 |

FOREIGN PATENT DOCUMENTS

| | | |
|---|---|---|
| JP | 11-340393 A | 12/1999 |
| JP | 2001-024126 A | 1/2001 |
| JP | 2001-177031 A | 6/2001 |
| JP | 2002-110878 A | 4/2002 |
| JP | 2004-080856 A | 3/2004 |
| JP | 2004-335516 A | 11/2004 |
| JP | 2006-203138 A | 8/2006 |

* cited by examiner

COOLING STRUCTURE FOR ELECTRIC DEVICE

CROSS REFERENCE TO RELATED APPLICATIONS

This application is a National Stage of International Application No. PCT/JP2006/321931 filed on Oct. 26, 2006, claiming priority based on Japanese Patent Application No. 2005-314757, filed Oct. 28, 2005, the contents of all of which are incorporated herein by reference in their entirety.

TECHNICAL FIELD

The present invention relates to a cooling structure for an electric device, particularly to a cooling structure for an electric device including a plurality of cooling medium paths.

BACKGROUND ART

Japanese Patent Laying-Open No. 11-340393 discloses a cooling structure for an inverter qualified as an electric device. In this structure, a fin is formed on a face of a heat receiving member opposite to the face where a semiconductor element is mounted. By fitting a lid over the fin, a path through which liquid flows from an external source is formed.

In the cooling structure disclosed in the aforementioned publication of Japanese Patent Laying-Open No. 11-340393, a plurality of cooling medium paths are defined by the fin. The flow rate of the cooling medium flowing from one inlet to the plurality of cooling medium paths may vary for each cooling medium path. Although this variation can be suppressed by increasing the distance between the inlet and the site where the plurality of cooling medium paths branch off, the cooling structure will be increased in size.

DISCLOSURE OF THE INVENTION

An object of the present invention is to provide a cooling structure for an electric device capable of suppressing variation in the flow rate of a cooling medium at a plurality of cooling medium paths while allowing reduction in size.

A cooling structure for an electric device according to the present invention includes an electric device, a plurality of cooling medium paths through which a cooling medium for the electric device flows, an inlet into which the cooling medium to be supplied to the plurality of cooling medium paths flows, and a cooling medium distribution mechanism provided between the inlet and the plurality of cooling medium paths to promote distribution of the cooling medium to each of the cooling medium paths.

By providing a cooling medium distribution mechanism according to the structure set forth above, distribution of the cooling medium to the plurality of cooling medium paths can be promoted without having to excessively increase the distance between the inlet into which the cooling medium flows and the site where a plurality of cooling medium paths branch off. As a result, variation in the flow rate of the cooling medium at the plurality of cooling medium paths can be suppressed while allowing reduction in size of the cooling structure for an electric device.

Preferably in the above-described cooling structure of an electric device, the cooling medium distribution mechanism promotes distribution of the cooling medium to each of the cooling medium paths by suppressing the flow of the cooling medium.

By way of example in the above-described cooling structure for an electric device, the plurality of cooling medium paths extend in a direction identical to each other, and the inlet and the plurality of cooling medium paths are aligned in a direction along which the plurality of cooling medium paths extend.

In the above-described cooling structure for an electric device, the cooling medium distribution mechanism preferably includes a wall extending in a direction crossing the aligning direction of the inlet and the plurality of cooling medium paths. The wall includes a portion provided to become lower in height with distance from the inlet.

According to the structure set forth above, the flow of the cooling medium into a cooling medium path at a location distant from the inlet can be promoted while the flow of the cooling medium to the cooling medium path in the neighborhood of the inlet can be suppressed by the wall provided between the inlet and the cooling medium paths, having a portion that becomes lower in height with distance from the inlet.

In the above-described cooling structure for an electric device, the electric device includes an inverter, by way of example. In this case, the inverter can be cooled effectively.

According to the present invention, variation in the flow rate of a cooling medium at a plurality of cooling medium paths can be suppressed while allowing reduction in the size of the cooling structure for an electric device.

BEST MODES FOR CARRYING OUT THE INVENTION

Embodiments of a cooling structure for an electric device according to the present invention will be described hereinafter. The same or corresponding elements have the same reference characters allotted, and description thereof may not be repeated.

Figure 1:
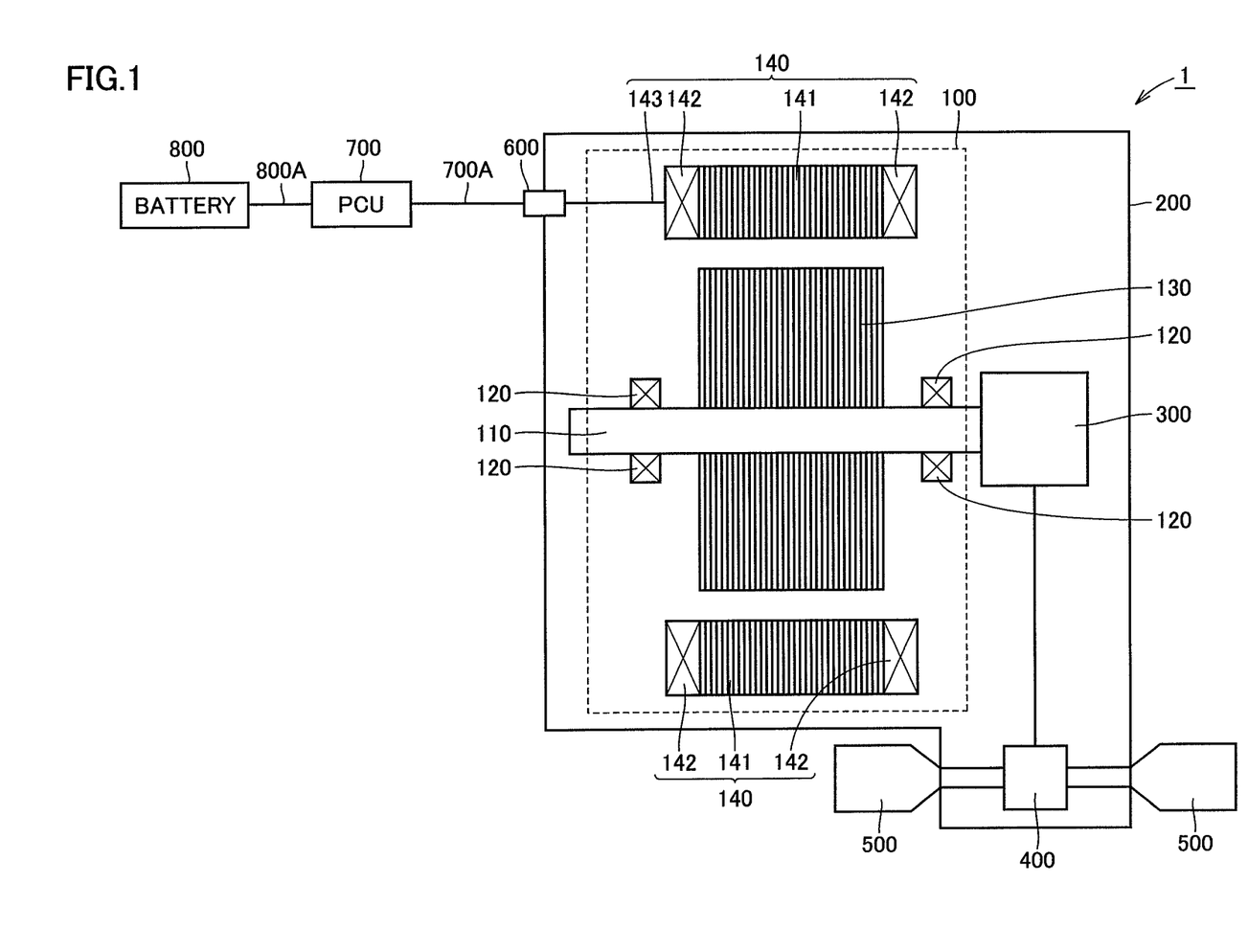
FIG. 1 schematically shows an example of a configuration of a drive unit including a cooling structure for an electric device according to an embodiment of the present invention.

FIG. 1 schematically shows an example of a configuration of a drive unit including a cooling structure for an electric device according to an embodiment of the present invention. In the embodiment shown in FIG. 1, a drive unit 1 is incorporated in a hybrid vehicle. A motor generator 100, a housing 200, a reduction gear mechanism 300, a differential mechanism 400, a drive shaft support 500, and a terminal base 600 constitute the drive unit.

Motor generator 100 is a rotating electric machine functioning as an electric motor or a power generator, and includes a rotational shaft 110 attached rotatable with housing 200 via a bearing 120, a rotor 130 attached to rotational shaft 110, and a stator 140.

Rotor 130 includes a rotor core formed of stacked plates of a magnetic substance such as iron, iron alloy, and the like, and permanent magnets embedded in the rotor core. The permanent magnets are arranged equally spaced from each other in the proximity of the outer circumference of the rotor core. The rotor core may be formed of powder magnetic core.

Stator 140 includes an annular stator core 141, a stator coil 142 wound around stator core 141 and a bus bar 143 connected to stator coil 142. Bus bar 143 is connected to a PCU (Power Control Unit) 700 via terminal base 600 provided at housing 200 and a power feed cable 700A. PCU 700 is connected to a battery 800 via a power feed cable 800A. Accordingly, battery 800 is electrically connected with stator coil 142.

Plates of a magnetic substance such as iron, iron alloy, and the like are stacked to constitute stator core 141. On the inner circumferential face of stator core 141 are formed a plurality of tooth sections (not shown) and a slot section (not shown) qualified as a recess between the teeth. The slot section is formed to open at the inner circumferential side of stator core 141. Stator core 141 may be formed of a powder magnetic substance.

Stator coil 142 including the three-phase winding of a U-phase, V-phase and W-phase is wound along the tooth section so as to fit in the slot section. The U-phase, V-phase and W-phase windings of stator coil 142 are wound in a manner deviated from each other on the circumference. Bus bar 143 includes a U-phase, V-phase and W-phase corresponding to the U-phase, V-phase and W-phase of stator coil 142.

Power feed cable 700A is a three-phase cable including a U-phase cable, V-phase cable, and W-phase cable. The U-phase, V-phase and W-phase bus bar 143 is respectively connected to the U-phase cable, V-phase cable and W-phase cable of power feed cable 700A.

The power output from motor generator 100 is transmitted from reduction gear mechanism 300 to drive shaft support 500 via differential mechanism 400. The driving force transmitted to drive shaft support 500 is transmitted to the wheel (not shown) as the torque via a drive shaft (not shown) to drive the vehicle.

In a regenerative braking mode of the hybrid vehicle, the wheel is rotated by the inertia force of the vehicle body. By the torque from the wheel, motor generator 100 is driven via drive shaft support 500, differential mechanism 400, and reduction gear mechanism 300. At this stage, motor generator 100 functions as a power generator. The electric power generated by motor generator 100 is stored in battery 800 via the inverter of PCU 700.

Drive unit 1 is provided with a resolver (not shown) including a resolver rotor and a resolver stator. The resolver rotor is connected to rotational shaft 110 of motor generator 100. The resolver stator includes a resolver stator core and a resolver stator coil wound around the core. By the resolver set forth above, the degree of rotation of rotor 130 of motor generator 100 is detected. The detected degree of rotation is transmitted to PCU 700. PCU 700 generates a drive signal to drive motor generator 100 based on the detected degree of rotation of rotor 130 and the torque command value from an external ECU (Electrical Control Unit) to provide the generated drive signal to motor generator 100.

Figure 2:
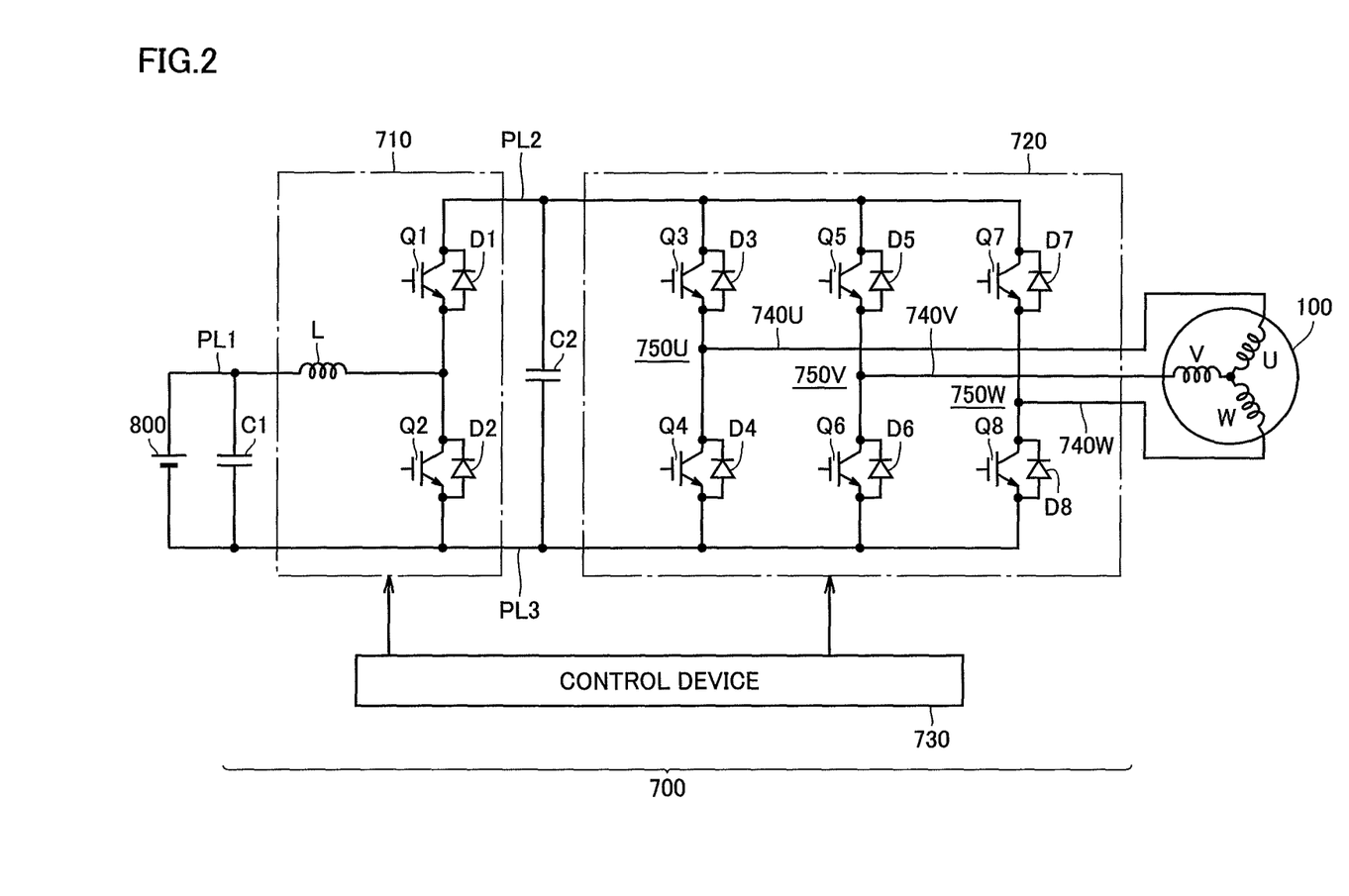
FIG. 2 is a circuit diagram of a configuration of a main part of the PCU shown in FIG. 1.

FIG. 2 is a circuit diagram of a configuration of the main part of PCU 700. Referring to FIG. 2, PCU 700 includes a converter 710, an inverter 720, a control device 730, capacitors C1 and C2, power supply lines PL1-PL3, and output lines 740U, 740V and 740W. Converter 710 is connected between battery 800 and inverter 720. Inverter 720 is connected to motor generator 100 via output lines 740U, 740V and 740W.

Battery 800 connected to converter 710 is a secondary battery such as of nickel hydride, lithium ion, or the like. Battery 800 supplies the generated direct current voltage to converter 710, or is charged by the direct current voltage received from converter 710.

Converter 710 includes power transistors Q1 and Q2, diodes D1 and D2, and a reactor L. Power transistors Q1 and Q2 are connected in series between power supply lines PL2 and PL3, and receive a control signal from control device 730 at the base. Diodes D1 and D2 are connected between the collector and emitter of power transistors Q1 and Q2, respectively, such that current flows from the emitter side to the collector side of power transistors Q1 and Q2, respectively. Reactor L has one end connected to power supply line PL1 that is connected to the positive terminal of battery 800 and the other end connected to the connection node of power transistors Q1 and Q2.

Converter 710 boosts the direct current voltage received from battery 800 by means of reactor L, and supplies the boosted voltage onto power supply line PL2. Converter 710 also down-converts the direct current voltage received from inverter 720 to charge battery 800.

Inverter 720 is formed of a U-phase arm 750U, a V-phase arm 750V and a W-phase arm 750W. Each phase arm is connected in parallel between power supply lines PL2 and PL3. U-phase arm 750U is formed of power transistors Q3 and Q4 connected in series. V-phase arm 750V is formed of power transistors Q5 and Q6 connected in series. W-phase arm 750W is formed of power transistors Q7 and Q8 connected in series. Diodes D3-D8 are connected between the collector and emitter of power transistors Q3-Q8 such that current flows from the emitter side to the collector side of power transistors Q3-Q8, respectively. The connection node of each power transistor of each phase arm is connected to the opposite side of the neutral point of each phase coil of motor generator 100 via output lines 740U, 740V and 740W.

Inverter 720 converts the direct current voltage from power supply line PL2 into alternating current voltage for output to motor generator 100 based on a control signal from control device 730. Inverter 720 rectifies the alternating current voltage generated by motor generator 100 into direct current voltage for output onto power supply line PL2.

Capacitor C1 is connected between power supply lines PL1 and PL3 to smooth the voltage level of power supply line PL1. Capacitor C2 is connected between power supply lines PL2 and PL3 to smooth the voltage level of power supply line PL2.

Control device 730 calculates the voltage of each phase coil of motor generator 100 based on the degree of rotation of the rotor of motor generator 100, the motor torque command value, the current value of each phase of motor generator 100, and the input voltage of inverter 720 to generate, based on the calculated result, a PWM (Pulse Width Modulation) signal for turning on/off power transistors Q3-Q8 and provides the generated signal to inverter 720.

Control device 730 also calculates the duty ratio of power transistors Q1 and Q2 to optimize the input voltage of inverter 720 based on the aforementioned motor torque command value and motor speed to generate, based on the calculated result, a PWM signal that turns on/off power transistors Q1 and Q2, and provides the generated signal to converter 710.

Furthermore, control device 730 controls the switching operation of power transistors Q1-Q8 of converter 710 and inverter 720 in order to convert the alternating current power generated by motor generator 100 into direct current power and charge battery 800.

At PCU 700, converter 710 boosts the direct current voltage received from battery 800 based on a control signal from control device 730 to provide the boosted voltage onto power supply line PL2. Inverter 720 receives the direct current voltage smoothed by capacitor C2 from power supply line PL2 to convert the received direct current voltage into alternating current voltage for output to motor generator 100.

Inverter 720 converts the alternating current voltage generated by the regenerative operation of motor generator 100 into direct current voltage for output onto power supply line PL2. Converter 710 receives the direct current voltage smoothed by capacitor C2 from power supply line PL2 to down-convert the received direct current voltage and charges battery 800.

Figure 3:
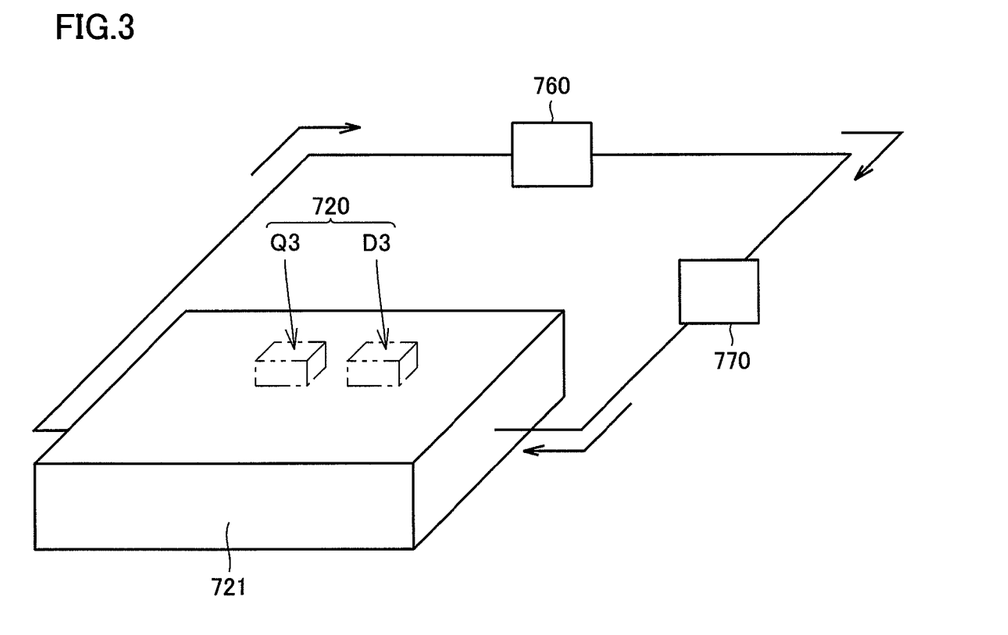
FIG. 3 shows an entire configuration of a cooling structure for an electric device according to an embodiment of the present invention.
Figure 4:
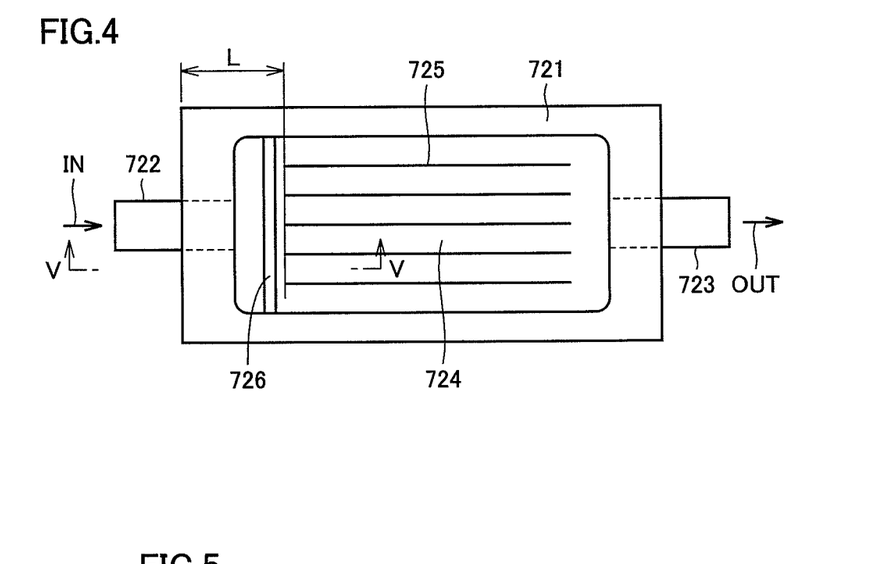
FIG. 4 is a plan view of the casing shown in FIG. 3.
Figure 5:
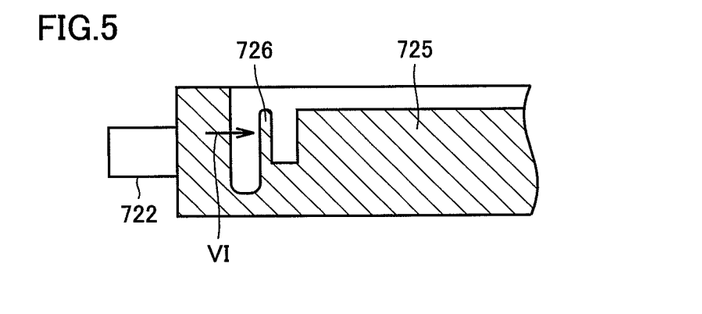
FIG. 5 is a sectional view taken along line V-V of FIG. 4.
Figure 6:
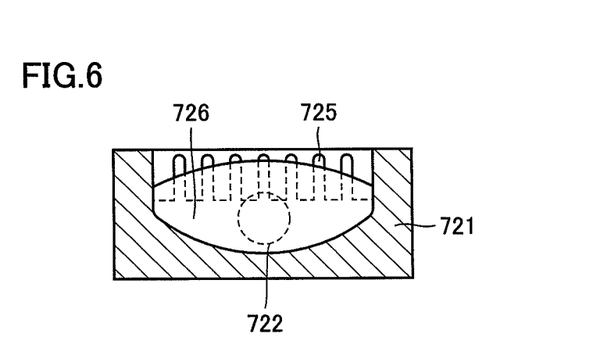
FIG. 6 is a view of the structure of FIG. 5 from the direction of arrow VI.

FIG. 3 shows a configuration of a cooling structure of inverter 720 according to an embodiment of the present invention. FIG. 4 is a plan view of the casing shown in FIG. 3. FIG. 5 is a sectional view taken along line V-V of FIG. 4. FIG. 6 is a view of the structure of FIG. 5 from the direction of arrow VI.

In FIGS. 4-6, the lid of casing 721 is not shown.

Referring to FIGS. 3-6, casing 721 is a die-cast case formed of, for example, aluminum. A cooling medium such as LLC (Long Life Coolant) flows in casing 721. The cooling medium flows into casing 721 from an inlet 722 in the direction of arrow IN and flows out from casing 721 through outlet 723 in the direction of arrow OUT. The cooling medium flowing out from casing 721 is delivered to a radiator 760 to be cooled. Then, the cooling medium flows into casing 721 again via inlet 722. Thus, cooling of inverter 720 (in FIG. 3, only power transistor Q3 and diode D3 are shown) mounted on casing 721 is promoted. The circulation of the cooling medium is effected by a water pump 770. Coolant water, an anti-freeze fluid, or the like may be used as the cooling medium.

A plurality of cooling medium paths 724 are formed in casing 721. The plurality of cooling medium paths 724 are partitioned by equally spaced fins 725 protruding perpendicular to the mounting face of an electric element. Accordingly, a plurality of cooling medium paths 724 extending in the same direction are provided.

A wall 726 is provided between inlet 722 and the site where a plurality of cooling medium paths 724 branch off. Wall 726 is provided in a direction crossing the extending direction of the plurality of cooling medium paths 724. In the examples of FIGS. 4-6, the extending direction of cooling medium paths 724 is orthogonal to the extending direction of wall 726. Fin 725 and wall 726 are formed integrally with casing 721.

Since the center portion of casing 721 in the width direction is close to inlet 722 through which the cooling medium flows in, the cooling medium readily flows to cooling medium path 724 located in proximity to the center portion of casing 721 in the width direction. In contrast, the cooling medium does not readily flow to cooling medium path 724 at the site distant from the center portion of casing 721 in the width direction due to the distant location from inlet 722 through which the cooling medium flows in, as compared to the center portion of casing 721 in the width direction. Therefore, there are concerns about degradation in the cooling performance of inverter 720 due to variation in the flow rate of the cooling medium between the plurality of cooling medium paths 724.

In the cooling structure of the present embodiment, the height of wall 726 is set lower with distance from the center portion of casing 721 in the width direction, as shown in FIG. 6. Accordingly, the flow of the cooling medium to cooling medium path 724 located distant from inlet 722 can be promoted while the flow of the cooling medium into cooling medium paths 724 located in proximity to inlet 722 is suppressed. As a result, variation in the flow rate of the cooling medium at the plurality of cooling medium paths 724 can be suppressed.

By providing wall 726 as set forth above, occurrence of a turbulent flow between wall 726 and fin 725 is promoted. It can be expected that the cooling performance is improved.

The inventors of the present application have confirmed that, in the case where wall 726 is not formed in the above-described structure, the flow rate at cooling medium path 724 located at the center portion of casing 721 in the width direction is highest, and is reduced with distance from the center portion of casing 721 in the width direction, and is increased again at the end portion of casing 721 in the width direction. Therefore, wall 726 may be provided such that the height becomes lower from the center portion to the peripheral portion of casing 721, and then increased again at the end portion of casing 721 in the width direction.

Figure 7:
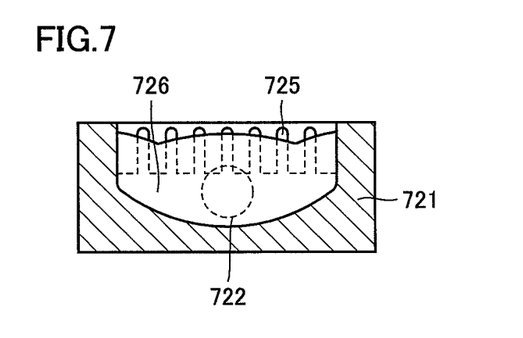
FIG. 7 represents a modification of the wall shown in FIGS. 4-6.
Figure 8:
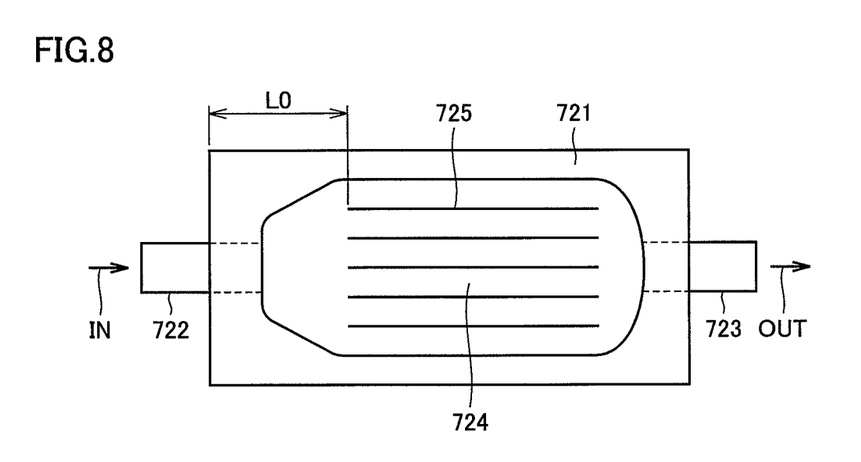
FIG. 8 is a plan view of a casing of a cooling structure for an electric device according to a comparative example.

FIG. 8 is a plan view of a cooling structure for an electric device according to a comparative example. Referring to FIG. 8, the distance (L0) from inlet 722 to fin 725 is provided relatively larger in the present comparative example as compared to the example (L) of FIGS. 4-7. As a result, the distance from inlet 722 to the branching site of the plurality of cooling medium paths 724 is increased, promoting distribution of the cooling medium. However, the increase of the distance (L0) from inlet 722 to fin 725 will result in a larger casing 721. This will prevent reduction in the size of the cooling structure for inverter 720.

In contrast, the cooling structure of the present embodiment can distribute the cooling medium without having to excessively increase the distance from inlet 722 to fin 725 by virtue of providing wall 726.

In recapitulation, the cooling structure for an electric device according to the present embodiment includes an inverter 720 qualified as "electric device", a plurality of cooling medium paths 724 through which a cooling medium for inverter 720 flows, an inlet 722 into which the cooling medium to be supplied to the plurality of cooling medium paths 724 flows, and a wall 726 provided between inlet 722 and the plurality of cooling medium paths 724, qualified as "cooling medium distribution mechanism" to promote distribution of the cooling medium to each of the cooling medium paths 724. Wall 726 promotes distribution of the cooling medium to each of cooling medium paths 724 by suppressing the flow of the cooling medium.

The plurality of cooling medium paths 724 extend in a direction identical to each other. Inlet 722 and the plurality of cooling medium paths 724 are aligned in the extending direction of the plurality of cooling medium paths 724. Further, wall 726 extends in a direction crossing the direction from inlet 722 towards cooling medium paths 724. Wall 726 is provided to become lower in height with distance from inlet 722.

In the present embodiment, distribution of the cooling medium is promoted by altering the height of wall 726. However, distribution of the cooling medium can be promoted with the height of wall 726 set constant by selectively forming a hole in wall 726 located distant from inlet 722, or by forming a hole in wall 726 at a position in proximity to inlet 722 and also at a position distant from inlet 722 with the size of the hole at the position distant from inlet 722 increased.

By providing the above-described wall 726 in the cooling structure of the present embodiment, distribution of the cooling medium to the plurality of cooling medium paths 724 can be promoted without excessively increasing the distance between inlet 722 into which the cooling medium flows and the branching site of the plurality of cooling medium paths 724. As a result, variation in the flow rate of the cooling medium to the plurality of cooling medium paths 724 can be suppressed while allowing reduction in the size of the cooling structure for inverter 720.

In the present embodiment, an example of inlet 722 located at the center portion of casing 721 in the width direction has been described. However, inlet 722 may be provided at a portion deviated from the center portion of casing 721 in the width direction.

It should be understood that the embodiments disclosed herein are illustrative and non-restrictive in every respect. The technical range of the present invention is defined by the appended claims, and all changes that fall within limits and bounds of the claims, or equivalent thereof are intended to be embraced by the claims.

Industrial Applicability

The present invention is applicable to a cooling structure for an electric device such as an inverter set forth above.

The invention claimed is:

1. A cooling structure for an electric device, comprising:
   an electric device,
   a casing on which said electric device is mounted,
   a plurality of cooling medium paths formed in said casing and through which a cooling medium for said electric device flows,
   an inlet into which said cooling medium to be supplied to said plurality of cooling medium paths flows, and
   a cooling medium distribution mechanism provided between said inlet and said plurality of said cooling medium paths to promote distribution of the cooling medium to each of said cooling medium paths, said cooling medium distribution mechanism including a wall over which the cooling medium flows, the wall extending in height from a bottom surface of said casing towards a top surface of said casing and extending in length perpendicular to said plurality of cooling medium paths,
   wherein the height of said wall becomes lower with greater distance from a center portion of said casing in a direction perpendicular to said plurality of cooling medium paths, and
   wherein said plurality of cooling medium path extend parallel to each other.

2. The cooling structure for an electric device according to claim 1, wherein said cooling medium distribution mechanism promotes distribution of the cooling medium to each of said cooling medium paths by suppressing a flow of the cooling medium to cooling medium paths located in the center portion of said casing in the direction perpendicular to said plurality of cooling medium paths.

3. The cooling structure for an electric device according to claim 1, wherein said electric device includes an inverter.

* * * * *